United States Patent [19]

Crisman et al.

[11] 3,978,333
[45] Aug. 31, 1976

[54] PHOTOVOLTAIC DEVICE HAVING POLYCRYSTALLINE BASE

[76] Inventors: Everett Crisman, 8 East St., Providence, R.I. 02907; William F. Armitage, Jr., 5 Baron Park Lane, Apt. 37, Burlington, Mass. 01803

[22] Filed: Apr. 15, 1974

[21] Appl. No.: 461,165

[52] U.S. Cl. .............................. 250/211 J; 136/89; 357/15; 357/30; 357/59
[51] Int. Cl.² ........................................ H01J 39/12
[58] Field of Search .................... 250/211 R, 211 J; 357/15, 30, 29, 59; 136/89

[56] References Cited
UNITED STATES PATENTS

| | | | |
|---|---|---|---|
| 2,820,841 | 1/1958 | Carlson et al. | 357/30 |
| 3,293,440 | 12/1966 | Mueller | 250/211 J |
| 3,442,007 | 5/1969 | Griffin et al. | 250/211 J |
| 3,607,466 | 9/1971 | Miyazaki | 357/59 |
| 3,615,877 | 10/1971 | Yamashita | 357/59 |
| 3,622,844 | 11/1971 | Barelli et al. | 357/30 |
| 3,765,956 | 10/1973 | Li | 357/59 |

Primary Examiner—Archie R. Borchelt
Assistant Examiner—D. C. Nelms
Attorney, Agent, or Firm—Salter & Michaelson

[57] ABSTRACT

A photovoltaic device comprising a polycrystalline base having an electrically conductive grid affixed to the surface of the device to which illumination is to be applied, said grid effecting a rectifying junction with the base and at the same time functioning as a current carrying contact, said grid being arranged so that substantially all of the individual crystallites are contacted at least once thereby, while at the same time maintaining the coverage of the base by said grid to a minimum.

9 Claims, 4 Drawing Figures

PHOTOVOLTAIC DEVICE HAVING POLYCRYSTALLINE BASE

BACKGROUND AND OBJECTS OF THE INVENTION

At the present time, commercially available high efficiency photovoltaic devices, or solar cells, as they are also known, are constructed by diffusing a suitable impurity into a single crystal base material to produce a p-n junction near the surface of the base to which illumination is to be applied, and in a plane parallel to said surface. The depth of the diffusion and the concentration of impurity atoms diffused are determined by trade-offs between the sheet resistance of the diffused layer and the optical absorption characteristics of the base material. These values will vary depending upon the particular material utilized for the single crystal base.

High efficiency cells of this type now in conventional use usually embody a single crystal silicon base, in which case it has been found that the depth of the diffusion preferably is about one micron, and the concentration of impurity atoms diffused is approximately $10^{19}/cc$. High efficiency cells of this type are used extensively for primary power production on space flights, since these cells have virtually infinite lifetimes with negligible performance degradation.

The main problem that exists in using solar cells of this type for large scale earth-based power systems has been the high cost of producing the single crystal wafers used as the starting material for cell production. For example, it has been found that the cost of solar cell power supplies for space applications has been estimated at $100.00 to $200.00 per watt, while the least expensive earth-based power supplies using single crystal silicon cells has been estimated as being in the neighborhood of $40.00 to $60.00 per watt. However, it has been estimated that to be financially competitive with atomic power, photovoltaic power supplies should not exceed an approximate cost of fifty cents per watt.

It is therefore a primary object of the present invention to eliminate the need for using single crystals as the starting material for high efficiency solar cell production. By eliminating this requirement, it is estimated that the cost per cell can be reduced 100 times. In addition, the present invention simplifies the manufacturing procedure presently being used in connection with high efficiency solar cells by eliminating the standard diffusion process that is used for forming the rectifying junction, thus further reducing the cost of the cell.

Other objects, features and advantages of the invention will become apparent as the description thereof proceeds when considered in connection with the accompanying illustrative drawings.

DESCRIPTION OF THE DRAWINGS

In the drawings which illustrate the best mode presently comtemplated for carrying out the present invention.

DESCRIPTION OF THE INVENTION

Since silicon is the most common semiconductor material used in commercial solar cell production, we desire to use polycrystalline silicon as the base material for the solar cells constructed in accordance with the present invention. However, it will be understood that the present invention is applicable to semiconductors other than silicon, such as germanium, indium phosphide, gallium arsenide, aluminum antimonide, gallium phosphide, gallium antimonide, cadmium sulfide, cadmium sellinide, cadmium telluride, zinc oxide, zinc sulfide, zinc sellinide, cupric sulfide, cupric oxide, titanium dioxide, aluminum arsenide, and aluminum gallium arsenide. Heretofore, polycrystalline silicon has been unacceptable as a base material for solar cell wafers because of the high probability of electron hole recombination at the grain or crystallite boundaries, and the problems associated with junction formation in polycrystalline material, i.e., preferred diffusion of dopant impurities along grain boundaries. In single crystal silicon the diffusion lengths of the electrons and holes are sufficient to allow the majority of photon-generated carriers to diffuse to the junction and be "collected" as electrical current. On the other hand, in polycrystalline material the diffusion lengths are determined primarily by the crystallite size; and, therefore, most of the electron-hole pairs diffuse to grain boundaries where they recombine and are thus lost to the electrical current. The present invention overcomes this problem by providing for electrical contact with each, or at least substantially each, individual crystallite or crystal grain, and therefore permits current collection from those areas which, in the single crystal base, do not have direct electrical contacts.

Figure 1:
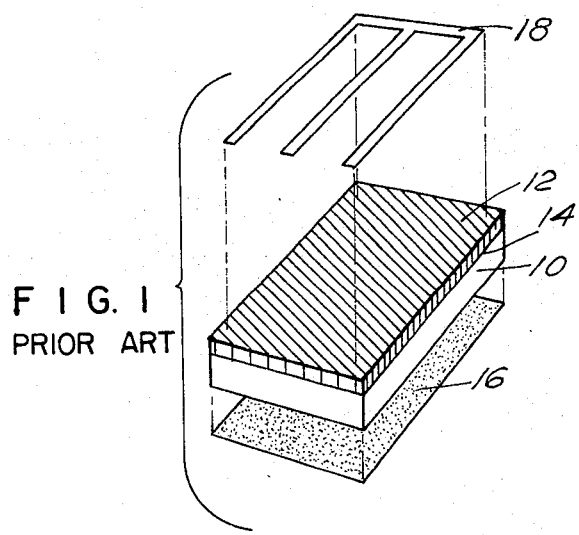
FIG. 1 is an exploded perspective view showing a conventional single crystal solar cell.
Figure 2:
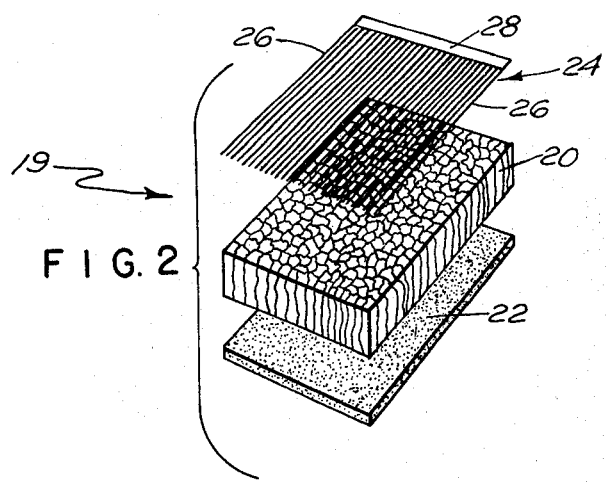
FIG. 2 is an exploded perspective view showing a polycrystalline solar cell constructed in accordance with the present invention.

Referring now to the drawings, FIG. 1 shows a conventional single crystal solar cell comprising a single crystal base wafer 10, preferably of silicon, the top surface of same, or the surface to which illumination is to be applied, having diffused thereon a suitable impurity layer 12 to produce a p-n junction 14 near the surface to be illuminated and in a plane parallel to said surface. A bottom surface 16 of electrically conductive metallic material is deposited on the underside of wafer 10 and functions as one of the ohmic contacts for the cell. The other ohmic contact 18, also a thin metal deposition, is applied to the top surface of the layer 12. Referring now to FIG. 2, there is shown a solar cell 19 constructed in accordance with the present invention comprising a polycrystalline base wafer 20, preferably of silicon, which preferably is deposited or grown on substrate 22, which substrate may function as the back or bottom surface electrical contact for the cell 19, assuming that the substrate 22 is of electrically conductive material. The deposition of the polycrystalline silicon wafer 20 on substrate 22 can be performed at moderate temperatures (less than the melting temperature of silicon) by decomposition of silicon-bearing gases, such as $SiCl_4$, $SiH_4$, etc., or at high temperatures by sheet casting of molten silicon. It is desirable to control the parameters affecting crystallite growth in the wafer 20 so that the crystallites grow to a predictable average size, which size is on the order of a diffusion length of the minority carriers in the base material.

This procedure is well known in the art and forms no part of the present invention.

The next step in the manufacture of the cell 19 is the deposition of a fine line grid pattern 24 on the top or front surface of the polycrystalline wafer 20, it being understood that this is the surface to which illumination is to be applied. It is important to note that the grid 24 effects a rectifying junction on the polycrystalline wafer and at the same time functions to collect and carry current from each crystallite. Thus, the affixation of the grid 24 to the polycrystalline wafer achieves two functions, i.e., effecting of the desired p-n junction, and, at the same time, the grid 24 functions as the ohmic contact on the front or top surface of the wafer. A critical feature of the present invention is the fact that the grid 24 is arranged so that the fingers 26 thereof make contact with substantially each and every crystallite or grain of wafer 20, this being why it is desirable that the wafer 20 be formed with grains or crystallites of generally the same size, where possible. It will be understood, however, that even where the polycrystalline base 20 comprises a few relatively large, central crystallites with smaller surrounding crystallites, the cell 19 will still work efficiently so long as the smaller crystallites are each contacted at least once by the fingers 26, to the extent that this is reasonably possible.

Figure 3:
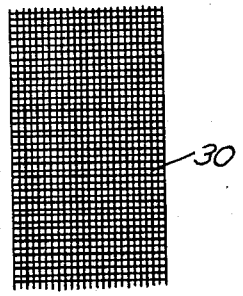
FIGS. 3 and 4 show modified forms of grid arrangements that may be used in connection with the present invention.
Figure 4:
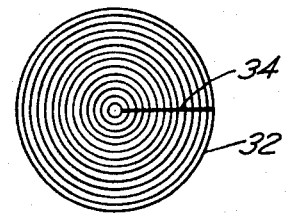

Since the grid 24 is functioning as an ohmic contact, obviously the fingers 26 must be interconnected by a conducting bar, such as shown at 28. It will be understood that the grid 24 may take other forms, such as the waffle pattern shown at 30 in FIG. 3 and the concentric pattern shown at 32 in FIG. 4, the latter arrangement comprising conducting bar 34. The important feature in any of these arrangements is that the grid contact substantially all of the individual crystallites of wafer 20, and it is also important that the fingers 26 of the grid be kept as narrow as reasonably possible so as to insure maximum exposure of the top surface of the base 20. It will be understood that the grids 24, 30 and 32 can be produced by any conventional techniques, such as the commercial photo-lithographic technique used in the microelectronic industry, or by direct vapor deposition through a suitable evaporation mask, or by laser evaporation of a thin film of metal deposited over the entire surface.

Once the metal grid has been deposited on the polycrystalline surface, a suitable heat treatment can be applied thereto to form an alloyed p-n junction or to form a Schottky barrier. For example, if the polycrystalline wafer is n-type silicon, then the grid may be aluminum or an aluminum bearing alloy. By heating the grid and wafer to a temperature of 576° C. or over, which temperature is the aluminum-silicon eutectic temperature, and subsequently cooling, a p-type layer will form on the n-type substrate, creating an abrupt p-n junction. The residual, unalloyed aluminum left on the p-type layer serves as the ohmic contact for the surface of the cell to be illuminated. If, however, the combination is heated below the aluminum-silicon eutectic temperature, but high enough to allow the aluminum to make intimate contact with the silicon—usually in the range of 500° C.—then an aluminum-silicon metal-semiconductor, or Schottky barrier junction, will be formed.

Where an alloyed p-n junction is being formed, it will be understood that if the polycrystalline base is n-type silicon, then the grid must be aluminum or an aluminum bearing alloy or other metal which is a p-type dopant, such as, for example, boron, indium or gallium. If the polycrystalline base is p-type silicon, then an n-type dopant must be used for the grid, such as an antimony and gold alloy. If a Schottky barrier is being formed, it has been found that whether the polycrystalline base is n-type silicon or p-type silicon, the grid may comprise aluminum, silver, gold, platinum, platinum silicide, tungsten or molybdenum.

It will be understood that the ohmic contact 22 provided on the unilluminated or underside of wafer 20 may be applied by any standard commercially known process, or, as previously indicated, it may be the substrate on which the polycrystal 20 is grown. It is thought that an aluminum-silicon alloyed p-n junction appears to offer the most attractive commercial possibilities for cell 19, primarily for economic reasons. It is thought, however, that formation of a Schottky barrier may possibly result in higher efficiency cells due to the possibility of using different metals in combination with silicon.

While there is shown and described herein certain specific structure embodying the invention, it will be manifest to those skilled in the art that various modifications and rearrangements of the parts may be made without departing from the spirit and scope of the underlying inventive concept and that the same is not limited to the particular forms herein shown and described except insofar as indicated by the scope of the appended claims.

We claim:

1. A photovoltaic device comprising a photoresponsive polycrystalline base having individual crystallites, said base having at least one substantially flat surface to which illumination is to be applied, and an electrically conductive grid affixed to said flat surface, said grid being arranged so that substantially all of the individual crystallites are contacted at least once by said grid, said grid being constructed of a material that will effect a rectifying junction with said base, said base having ohmic electrical contact means affixed thereto at a point spaced from said grid.

2. In the device of claim 1, said base being of a material selected from the group consisting of silicon, germanium, indium phosphide, gallium arsenide, aluminum antimonide, gallium phosphide, gallium antimonide, cadmium sulfide, cadmium sellinide, cadmium telluride, zinc oxide, zinc sulfide, zinc sellinide, cupric sulfide, cupric oxide. titanium dioxide, aluminum arsenide, and gallium aluminum arsenide.

3. In the device of claim 1, said grid being affixed to said base by an alloyed junction.

4. In the device of claim 3, said base being constructed of an n-type silicon and said grid comprising aluminum.

5. In the device of claim 3, said base being constructed of a p-type silicon, and said grid comprising antimony and gold.

6. In the device of claim 1, said rectifying junction being a Schottky barrier.

7. In the device of claim 6, said base being constructed of n-type silicon, and said grid being of a material selected from the group consisting of aluminum, silver, gold, platinum, platinum silicide, tungsten or molybdenum.

8. In the device of claim 6, said base being constructed of p-type silicon, and said grid being of a material selected from the group consisting of aluminum, silver, gold, platinum, platinum silicide, tungsten of molybdenum.

9. In the device of claim 1, said grid comprising a plurality of spaced, strip portions electrically interconnected to each other, said portions being arranged so as to effect minimum possible coverage of said base while at the same time making contact with substantially all of said individual crystallites.

\* \* \* \* \*